(12) United States Patent
Liu et al.

(10) Patent No.: US 9,240,485 B2
(45) Date of Patent: Jan. 19, 2016

(54) THIN FILM TRANSISTOR AND METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Xiang Liu, Beijing (CN); Gang Wang, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/352,182

(22) PCT Filed: Jul. 2, 2013

(86) PCT No.: PCT/CN2013/078701
§ 371 (c)(1),
(2) Date: Apr. 16, 2014

(87) PCT Pub. No.: WO2014/146380
PCT Pub. Date: Sep. 25, 2014

(65) Prior Publication Data
US 2015/0179809 A1   Jun. 25, 2015

(30) Foreign Application Priority Data
Mar. 21, 2013  (CN) .......................... 2013 1 0092496

(51) Int. Cl.
*H01L 29/786* (2006.01)
*H01L 29/45* (2006.01)
(Continued)

(52) U.S. Cl.
CPC ........ *H01L 29/78606* (2013.01); *H01L 21/441* (2013.01); *H01L 27/1225* (2013.01);
(Continued)

(58) Field of Classification Search
CPC ..................... H01L 29/78606; H01L 29/7869;
H01L 29/66969; H01L 29/4908; H01L 29/45; H01L 27/1225; H01L 27/1259; H01L 21/441; H01L 2924/01029; H01L 2924/0132; H01L 2224/05647; H01L 2224/45147
See application file for complete search history.

(56) References Cited

U.S. PATENT DOCUMENTS

2008/0308821 A1*  12/2008  Hsu ................................ 257/89
2009/0173944 A1*  7/2009  Chen ................. H01L 29/41733
257/66
(Continued)

FOREIGN PATENT DOCUMENTS

CN         1687837 A    10/2005
CN       101217151 A     7/2008
(Continued)

OTHER PUBLICATIONS

First Chinese Office Action dated Feb. 15, 2015; Appln. No. 201310092496.5.
(Continued)

*Primary Examiner* — Julio J Maldonado
*Assistant Examiner* — Farun Lu
(74) *Attorney, Agent, or Firm* — Ladas & Parry LLP

(57) ABSTRACT

A thin film transistor comprises a substrate; a gate electrode, a source electrode, a drain electrode and a semiconductor layer formed on the substrate; a gate insulating layer between the gate electrode and the semiconductor layer or between the gate electrode and the source and drain electrodes; an etching stop layer between the semiconductor layer and the source and drain electrodes having a source contact hole and a drain contact hole therein; and a source buffer layer between the source electrode and the semiconductor layer and a drain buffer layer between the drain electrode and the semiconductor layer. The source and drain electrodes are metal Cu electrodes, and the source and drain buffer layers are Cu alloy layer.

19 Claims, 4 Drawing Sheets

(51) Int. Cl.
*H01L 21/441* (2006.01)
*H01L 27/12* (2006.01)
*H01L 29/49* (2006.01)
*H01L 29/66* (2006.01)

(52) U.S. Cl.
CPC ............ *H01L27/1259* (2013.01); *H01L 29/45* (2013.01); *H01L 29/4908* (2013.01); *H01L 29/66969* (2013.01); *H01L 29/7869* (2013.01); *H01L 29/78693* (2013.01)

(56) References Cited

U.S. PATENT DOCUMENTS

| | | |
|---|---|---|
| 2010/0165227 A1 | 7/2010 | Liu et al. |
| 2011/0013130 A1 | 1/2011 | Choi et al. |
| 2011/0062433 A1 | 3/2011 | Yamazaki |
| 2011/0212569 A1 | 9/2011 | Yamazaki et al. |
| 2011/0273075 A1 | 11/2011 | Goto et al. |
| 2013/0122323 A1* | 5/2013 | Miki et al. .................... 428/632 |
| 2013/0264564 A1* | 10/2013 | Park .................. H01L 29/66742 257/43 |
| 2014/0138642 A1* | 5/2014 | Kim ................................ 257/40 |

FOREIGN PATENT DOCUMENTS

| | | |
|---|---|---|
| CN | 101957529 A | 1/2011 |
| CN | 102265323 A | 11/2011 |
| CN | 102646684 A | 8/2012 |
| JP | 2010-171063 A | 8/2010 |
| KR | 20100080465 A | 7/2010 |
| KR | 20120071397 | 7/2012 |
| KR | 20130024892 A | 3/2013 |

OTHER PUBLICATIONS

Second Chinese Office Action dated Jun. 30, 2015; Appln. No. 201310092496.5.

Korean Office Action dated May 1, 2015; Appln. No. 10-2014-7011048.

International Preliminary Report on Patentability Appln. No. PCT/CN2013/078701; Dated Sep. 22, 2015.

Korean Office Action dated Nov. 11, 2015; Appln. No. 10-2014-7011048.

* cited by examiner

THIN FILM TRANSISTOR AND METHOD FOR MANUFACTURING THE SAME, ARRAY SUBSTRATE AND DISPLAY DEVICE

TECHNICAL FIELD

Embodiments of the present invention relates to the technical field of display, and particularly, to a thin film transistor and a method for manufacturing the same, an array substrate and a display device.

BACKGROUND

Thin Film Transistor Liquid Crystal Displays (TFT-LCDs) and Organic Light Emitting Displays (OLEDs) occupy an important position in the field of flat panel display technology for their advantages such as lightweight, thinness, low power consumption, high brightness, high image quality and so on. At present, flat panel display devices such as liquid crystal TVs that are of large size, high resolution and high image quality, and in particular, dominate in the current market of flat panel display devices.

Currently, delay of image signal has become one of the key factors that restrict the development of the flat panel display devices of large size, high resolution and high image quality. Decrease of the resistance of a source electrode, a drain electrode, a gate line and a data line can reduce delay of image signal and hence improve image quality. At present, a method for decreasing the resistance of gate lines and data lines is to fabricate source electrodes, drain electrodes, gate lines and data lines by using metal Cu that has low resistivity. However, the method has the following disadvantages.

The adhesion of metal Cu is poor, and although a buffer layer of Mo, Ti, Mo alloy, Ti alloy or the like is typically used for improving the adhesion of Cu, the resulted TFT has a poor performance and thus image quality is poor due to the poor adhesion of Cu.

SUMMARY

To overcome the above disadvantages, an embodiment of the present invention provides a thin film transistor comprising: a substrate; a gate electrode, a source electrode, a drain electrode and a semiconductor layer formed on the substrate; a gate insulating layer between the gate electrode and the semiconductor layer or between the gate electrode and the source and drain electrodes; an etching stop layer between the semiconductor layer and the source and drain electrodes having a source contact hole and a drain contact hole therein; and a source buffer layer between the source electrode and the semiconductor layer and a drain buffer layer between the drain electrode and the semiconductor layer. The source and drain electrodes are metal copper electrodes, and the source and drain buffer layers are Cu alloy layer.

For example, the thin film transistor may further comprises a conductive source isolating layer between the source buffer layer and the semiconductor layer and a conductive drain isolating layer between the drain buffer layer and the semiconductor layer.

For example, the source and drain isolating layers are arranged in a same layer, the source isolating layer completely covers the source contact hole, and the drain isolating layer completely covers the drain contact hole.

For example, the thin film transistor may further comprise a pixel electrode layer arranged in a same layer as the source and drain isolating layers.

For example, the source and drain isolating layers and the pixel electrode layer are conductive layer of indium tin oxide or indium zinc oxide film For example, the source and drain buffer layers are a layer of copper aluminum alloy, copper manganese alloy, copper thallium alloy, copper titanium alloy or copper hafnium alloy.

For example, the gate electrode is located on the substrate; the gate insulating layer is located on the gate electrode, the semiconductor layer is located on the gate insulating layer, and the etching stop layer is located on the semiconductor layer and has the source and drain contact holes therein.

The source and drain isolating layers are located on the etching stop layer, the source isolating layer contacts the semiconductor layer at the source contact hole, and the drain isolating layer contacts the semiconductor layer at the drain contact hole; the source buffer layer is located on the source isolating layer, and the drain buffer layer is located on the drain isolating layer; and the source electrode is located on the source buffer layer, and the drain electrode is located on the drain buffer layer.

For example, the semiconductor layer is located on the substrate; the etching stop layer is located on the semiconductor layer and has the source and drain contact holes therein; the source and drain isolating layers are located on the etching stop layer, the source isolating layer contacts the semiconductor layer at the source contact hole, and the drain isolating layer contacts the semiconductor layer at the drain contact hole; the source buffer layer is located on the source isolating layer, and the drain buffer layer is located on the drain isolating layer; the source electrode is located on the source buffer layer, and the drain electrode is located on the drain buffer layer; the gate insulating layer is located on the source and drain electrodes; and the gate electrode is located on the gate insulating layer.

For example, the thin film transistor may further comprise a protection layer as the outmost layer of the thin film transistor, and the protection layer comprises a portion in a displaying region of the substrate and a portion in a pad region in a periphery of the substrate.

An embodiment of the present invention provides an array substrate including the thin film transistor one of above mentioned thin film transistor.

An embodiment of the present invention provides a display device including the above mentioned array substrate.

An embodiment of the present invention provides a method for manufacturing a thin film transistor comprising the steps of: forming a pattern of a gate electrode, a pattern of a source electrode, a pattern of a drain electrode, and a pattern of a semiconductor layer; forming a pattern of a gate insulating layer and a pattern of an etching stop layer; and forming a pattern of a source buffer layer and a pattern of a drain buffer layer. The gate insulating layer is located between the gate electrode and the semiconductor layer or between the gate electrode and the source and drain electrodes, the etching stop layer is located between the semiconductor layer and the source and drain electrodes, and the source and drain buffer layers are located between the source and drain electrodes respectively and the semiconductor layer. The source and drain electrodes are metal Cu electrodes, and the source and drain buffer layers are a Cu alloy layer.

For example, before forming the source and drain buffer layers, a conductive source isolating layer between the source buffer layer and the semiconductor layer and a conductive drain isolating layer between the drain buffer layer and the semiconductor layer are formed.

For example, the method may comprises: forming the pattern of the gate electrode on the substrate by using a patterning process; forming the pattern of the gate insulating layer on the substrate with the pattern of the gate electrode formed thereon by using a patterning process; forming the pattern of the semiconductor layer on the substrate with the pattern of the gate insulating layer thereon by using a patterning process; forming the pattern of the etching stop layer on the substrate with the pattern of the semiconductor layer thereon by using a patterning process, the etching stop layer having a source contact hole and a drain contact hole therein; forming the pattern of the source and drain isolating layers on the substrate with the pattern of the etching stop layer thereon by using a patterning process; and forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process.

For example, the method may comprise: forming the pattern of the semiconductor layer on the substrate by using a patterning process; forming the pattern of the etching stop layer on the substrate with the pattern of the semiconductor layer thereon by using a patterning process, the etching stop layer having a source contact hole and a drain contact hole therein; forming the pattern of the source isolating layer at the source contact hole and a patterned drain isolating layer at the drain contact hole on the substrate with the pattern of the etching stop layer thereon by using a patterning process; forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process; forming the pattern of the gate insulating layer on the substrate with the pattern of the source and drain electrodes formed thereon by using a patterning process; and forming the pattern of the gate electrode on the substrate with the gate insulating layer formed thereon by using a patterning process.

For example, the pixel electrode is formed in a same process as the source and drain isolating layers, and forming the pixel electrode, the source and drain isolating layers comprises: forming a layer of conductive film on the substrate with the pattern of the etching stop layer formed thereon by using a film coating process; and forming the pattern of the source isolating layer at the source contact hole, the pattern of the drain isolating layer at the drain contact hole, and the pattern of the pixel electrode from the layer of conductive film by using a patterning process.

For example, forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process comprises: forming a layer of Cu alloy film and a layer of Cu film in this order on the substrate with the source and drain isolating layers formed thereon by using a film coating process; heating the substrate with the layer of Cu alloy film and the layer of Cu film formed thereon such that the layer of Cu alloy film becomes a bi-layer film after being heated, the bi-layer film comprising a metal Cu layer as an upper layer and a metal film formed from the metal other than Cu in the Cu alloy as a lower layer; and patterning the layer of Cu alloy film and the layer of Cu film that have been heated so as to form the source and drain buffer layers, the source electrode on the source buffer layer and the drain electrode on the drain buffer layer.

For example, forming the layer of Cu alloy film formed by using the film coating process may comprise forming a layer of Cu alloy film by using a film coating process which contains Cu and another metal of which the molar percent in the Cu alloy is in the range of 0.1%~30%.

DETAILED DESCRIPTION

In order to improve image quality, embodiments of the present invention provide a thin film transistor with improved performance and a method for manufacturing the same, an array substrate and a display device.

The TFT provided by an embodiment of the present invention is applicable to, but not limited to, a display device of a planar electric field core technology such as an ADS type display device. ADS refers to advanced super dimension switch, and is the core of the planar electric field technology in which a multi-dimensional electric field is formed from both the electric field generated at edges of slit electrodes (common electrode) in a same plane and the electric field generated between a slit electrode layer and a plate-like electrode layer so that liquid crystal molecules at all orientations, which are located directly above the electrodes and between the slit electrodes in a liquid crystal cell can be rotated and thus the work efficiency of liquid crystal can be enhanced and the light transmittance can be increased. The ADS technology can improve the image quality of a TFT-LCD product and provides such advantages as high resolution, high transmittance, low power consumption, wide view angle, high aperture ratio, low chromatic aberration, free of push Mura and the like. In order to accommodate to different application, the ADS technology is adapted so as to comprise high transmittance ADS (I-ADS) technology, high aperture ratio ADS (H-ADS) technology and high resolution ADS (S-ADS) technology and the like.

A conductive buffer layer, which may be Cu alloy, is provided between the semiconductor layer and the source/drain layer in the TFT provided by an embodiment of the present invention so as to improve the adhesion between the semiconductor layer and the source/drain layer and thus improve the performance of the TFT.

The TFT provided by an embodiment of the present invention may be a bottom gate structure or a top gate structure. In the following, the TFT, the array substrate and the display provided by the embodiments of the present invention will be detailed with reference to the accompanying drawings by taking a bottom gate TFT as an example.

Figure 1:
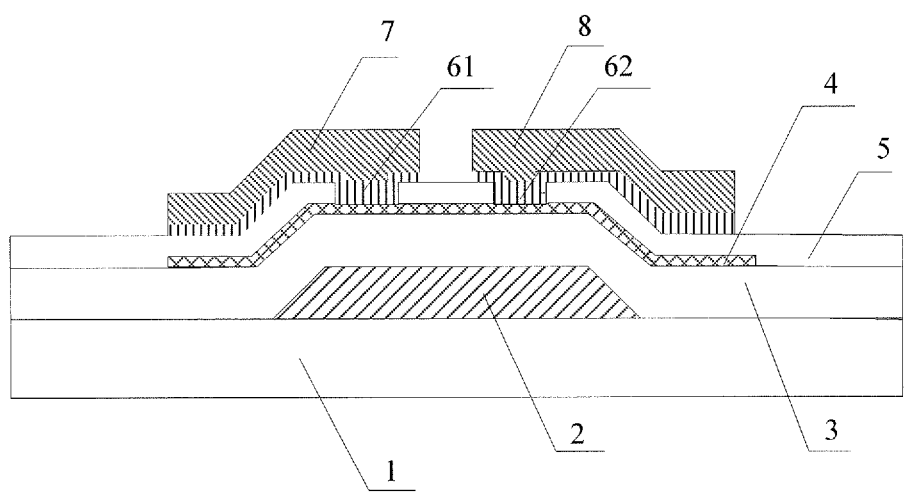
FIG. 1 schematically shows the structure of a bottom gate TFT according to an embodiment of the present invention.

FIG. 1 schematically shows a cross-section view of the TFT provided by a first embodiment, which comprise a substrate 1, a gate electrode 2 on the substrate 1, a gate insulating layer 3 on the gate electrode 2, a semiconductor layer 4 on the gate insulating layer 3, an etching stop layer 5 on the semiconductor layer 4 which has a source contact hole and a drain contact hole therein, a source buffer layer 61 and a drain buffer layer 62 overlaying the etching stop layer 5 to cover the source contact hole and the drain contact hole and corresponding to a source electrode 7 and a drain electrode 8, and the source electrode 7 on the source buffer layer 61 and the drain electrode 8 on the drain buffer layer 62.

The source buffer layer 61 and the drain buffer layer 62 are formed of Cu alloy, and the source electrode 7 and the drain electrode 8 are formed of metal Cu.

In the TFT illustrated in FIG. 1, Cu alloy is used as the source buffer layer and drain buffer layer, which improve the adhesion between the semiconductor layer and the source and drain electrodes of metal Cu and thus the performance of the TFT.

For example, the Cu alloy may be, but not limited to, copper-manganese (CuMn) alloy, copper-aluminum (CuAl) alloy, copper-thallium (CuTa) alloy, copper-titanium (CuTi) alloy, copper-hafnium (CuHa) alloy, or the like.

For example, the molar percent of the atoms other than Cu atoms in the Cu alloy is in the range of 0.1%~30%. Here, since the source electrode and the drain electrode formed of Cu have strong adhesion to the semiconductor layer, the TFT have an excellent performance.

For example, the semiconductor layer provided in the embodiments of the present invention may comprise a metal oxide such as indium gallium zinc oxide (IGZO), hafnium indium zinc oxide (HIZO), indium zinc oxide (IZO), amorphous indium zinc oxide (a-InZnO), amorphous fluorine doped zinc oxide (ZnO:F), tin doped indium oxide (In2O3:Sn), amorphous molybdenum doped indium oxide (In2O3:Mo), chromium tin oxide (Cd2SnO4), amorphous aluminum doped zinc oxide (ZnO:Al), amorphous niobium doped titanium oxide (TiO2:Nb), chromium tin oxide (Cd—Sn—O), or other metal oxide.

Figure 2:
FIG. 2 schematically shows the alloy structure before heating according to an embodiment of the present invention.
Figure 3:
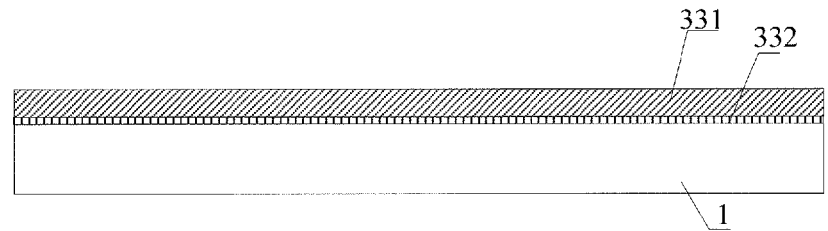
FIG. 3 schematically shows the alloy structure obtained after the structure of FIG. 2 being heated.

Other atoms than Cu atoms such as Mn or Al atoms will be segregated from the Cu alloy when it is heated, and two metal layers with good adhesion, of which the upper one is Cu layer and the bottom one is a layer of the metal other than Cu such as a Mn layer, an Al layer or the like. The layer of the metal other than Cu, such as a Mn layer or an Al layer, is thin and attached to the bottom surface of the Cu layer. FIG. 2 shows the Cu alloy 33 before the substrate 1 is heated, and FIG. 3 shows the Cu alloy after the substrate 1 is heated, and the Cu alloy comprises a Cu layer 331 and a layer of another metal 332.

Because the layer of the metal other than Cu, such as the Mn layer or the Al layer, contacts the semiconductor layer and the semiconductor layer comprises a metal oxide semiconductor layer, the metal other than Cu can capture the oxygen atoms from the semiconductor layer such that the metal oxide semiconductor lacks of oxygen atoms, which degrades the performance of the TFT.

Figure 4:
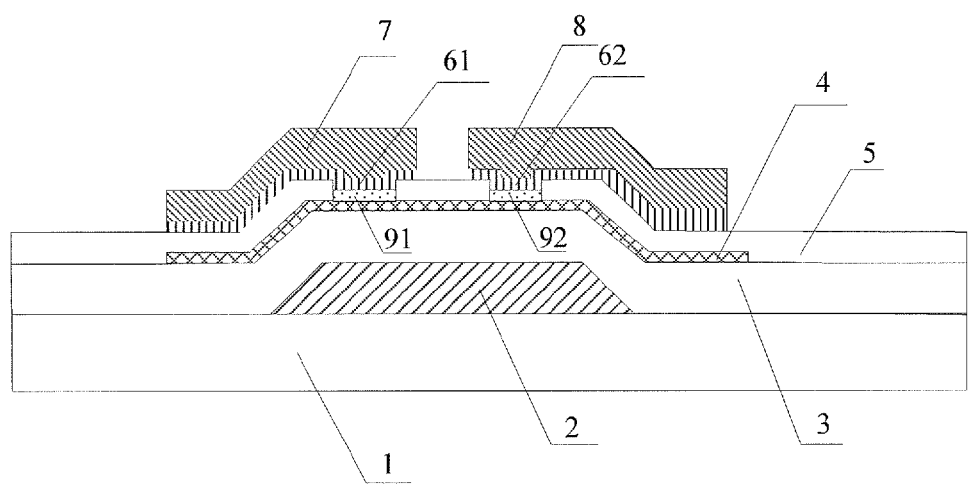
FIG. 4 schematically shows the structure of the TFT of FIG. 1 with an isolating layer.

In order to overcome the above problem, as illustrated in FIG. 4, the TFT provided by an embodiment of the present invention further comprises a source isolating layer 91 between the source buffer layer 61 and the semiconductor layer 4 and a drain isolating layer 92 between the drain buffer layer 62 and the semiconductor layer 4.

The source isolating layer 91 is located on the etching stop layer 5 and in the source contact hole, and the drain isolating layer 92 is located on the etching stop layer 5 and in the drain contact hole.

The source isolating layer 91 and the drain isolating layer 92 are each a conductive metal oxide film that may be for example a transparent conductive film such as an indium tin oxide (ITO) film, an indium zinc oxide (IZO) film or the like. The source isolating layer 91 and the drain isolating layer 92 can prevent the minority metal atoms in the Cu alloy capturing the oxygen atoms from the metal oxide semiconductor layer.

In addition, because the source isolating layer 91 and the drain isolating layer 92 are each a layer of conductive metal oxide film and the semiconductor layer is also a layer of conductive metal oxide film, the contact resistance therebetween is low where the two layers contact with each other so that the on-current and thus the performance of the TFT is improved.

Figure 5:
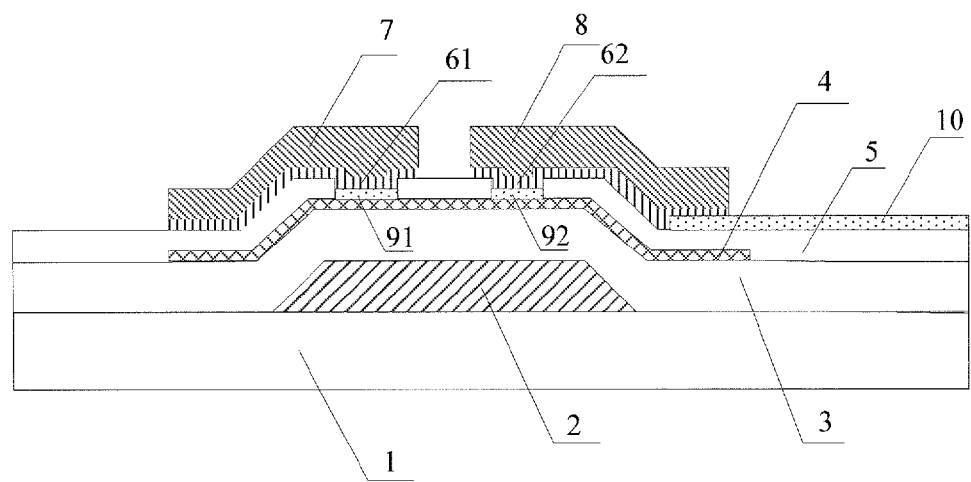
FIG. 5 schematically shows the structure of the TFT of FIG. 4 with a pixel electrode.

With reference to FIG. 5, the TFT provided by an embodiment of the present invention further comprises a pixel electrode 10 arranged in the same level as the source isolating layer 91 and the drain isolating layer 92. The pixel electrode 10 is electrically connected to the source electrode 8.

The source isolating layer 91, the drain isolating layer 92 and the pixel electrode 10 comprise a conductive layer of indium tin oxide, indium zinc oxide or the like. The source isolating layer 91 and the drain isolating layer 92, and the semiconductor layer are all metal oxide layers, and the quality of the interface therebetween is superior to that of the interface between a metal and a metal oxide semiconductor, which improves the performance of the TFT.

Furthermore, the source and drain electrodes are located above the pixel electrode, and the drain electrode is connected to the pixel electrode. That is, an end portion of the drain electrode overlays another end portion of the pixel electrode, which can avoid the problem of the disconnection of the pixel electrode and improve the yield of products as compared to the situation in which the pixel electrode is connected to the drain electrode through a via.

Figure 6:
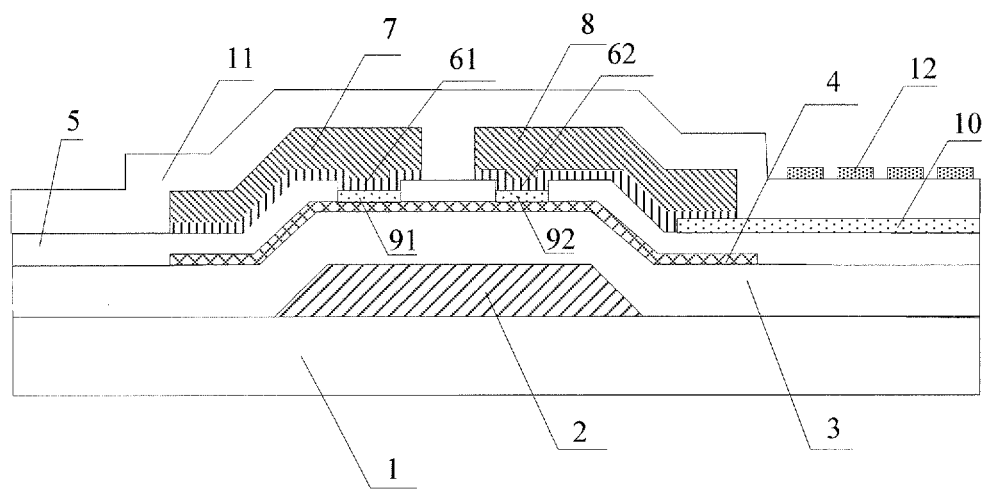
FIG. 6 schematically shows the structure of the TFT of FIG. 5 with a protection layer and a common electrode.

Referring to FIG. 6, the TFT provided by an embodiment of the present invention may further comprises a protection layer 11 on the source and drain electrodes 7, 8 and a common electrode 12 on the protection layer 11 in the region corresponding to that of the pixel electrode 10.

The protection layer 11 may be, but not limited to, oxide, nitride, oxynitride or the like. The oxide may be silicon oxide. The protection layer 11 may also be an aluminum oxide (Al2O3) layer. The protection layer 11 may be a bi-layer structure in which one layer may be oxide, nitride or oxynitride and the other layer may be an Al2O3 layer. The protection layer of a bi-layer structure provides a stronger protection to the TFT by preventing not only air from entering the TFT from outside but also the scuffing by foreign object.

The protection layer 11 may also be an organic resin layer, which may be benzocyclobutene (BCB) or other organic photosensitive materials.

It should be noted that, in practice, the protection layer 11 cover the entirety of the substrate, and a pattern of pads for connecting with the gate lines (Gate Pad) and a pattern of pads for connecting the data lines (SD pad) are provided in the periphery region of the substrate, therefore the pattern of the protection layer 11 should be formed in one etching process.

In the TFT as illustrated in FIG. 6, the common electrode 12 may be a slit electrode.

Advanced super dimension fields can be generated between the slit-like common electrodes 12 and the plate-like pixel electrode 10 and by the slit-like common electrodes 12 themselves.

Hereinabove, a bottom gate type TFT has been described. A top gate TFT is different from the bottom gate type TFT only in arrangement and will be briefly discussed in the following.

Figure 7:
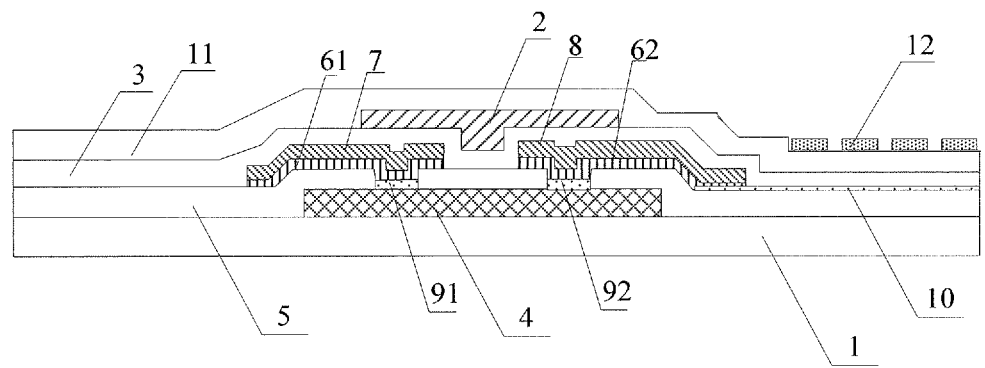
FIG. 7 schematically shows the structure of a top gate TFT provided by an embodiment of the present invention.

FIG. 7 shows a top gate type TFT comprising a substrate 1, a semiconductor layer 4 on the substrate 1, an etching stop layer 5 on the semiconductor layer 4 which has a source contact hole and a drain contact hole therein, a source isolating layer 91 and a drain isolating layer 92 on the etching stop layer 5, a source buffer layer 61 on the source isolating layer 91 and a drain buffer layer 62 on the drain isolating layer 92, a source electrode 7 on the source buffer layer 61 and a drain electrode 8 on the drain buffer layer 62, a gate insulating layer 3 on the source electrode 7 and the drain electrode 8, a gate electrode 2 on the gate insulating layer 3, and a protection layer on the gate electrode 2.

The top gate TFT structure may further comprise a pixel electrode between the etching stop layer 5 and the drain buffer layer 62, and a common electrode 12 on the protection layer 11 that are in the region corresponding to that of the pixel electrode 10.

The top gate TFT as illustrated in FIG. 7 is similar to the bottom gate TFT except their arrangement and will not be described in detail.

It should be noted that in both the bottom gate TFT and the top gate TFT, the semiconductor layer is located beneath the source and drain electrodes, there are the source buffer layer and the source isolating layer from top to bottom between the source electrode and the semiconductor layer, and the drain buffer layer and the drain isolating layer from top to bottom between the drain electrode and the semiconductor layer (i.e., the drain isolating layer is located beneath the drain buffer layer). The source and drain buffer layers in the bottom gate TFT are also applicable to the top gate TFT and will not be described herein.

An embodiment of the present invention also provides an array substrate comprising the top gate TFT or the bottom gate TFT mentioned above.

Figure 8:
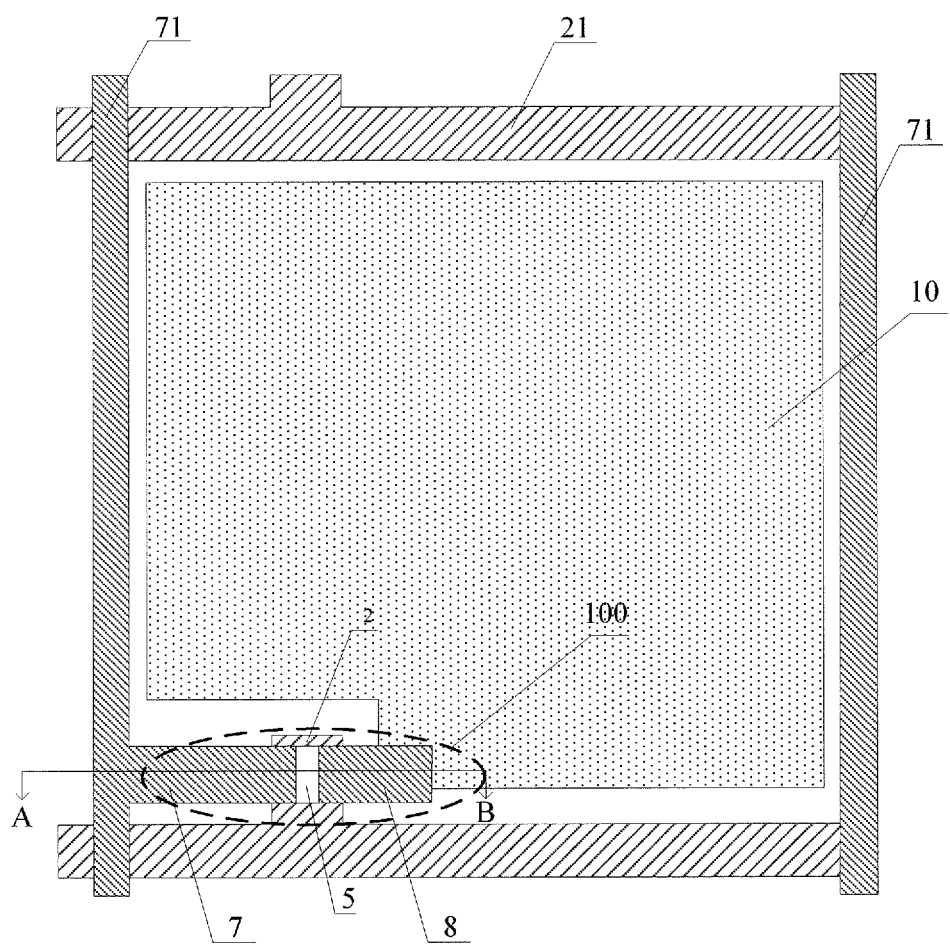
FIG. 8 schematically shows a top view of an array substrate provided by an embodiment of the present invention.

Referring to FIG. 8, the array substrate comprises a gate line 21 connected to the gate electrode 2 of the TFT 100 and a data line 71 connected to the source electrode 7 of the TFT 100. The gate line 21 and the data line 71 intersect each other.

FIG. 1 and FIGS. 4-7 are cross-section views taken along line A-B in FIG. 8.

An embodiment of the present invention provides a method for manufacturing a TFT comprising the following steps:

forming patterns of a gate electrode, a source electrode, a drain electrode, and a semiconductor layer; and forming patterns of a gate insulating layer, an etching stop layer; and forming patterning a source buffer layer and a drain buffer layer.

The gate insulating layer is arranged between the gate electrode and the semiconductor layer or between the gate electrode and the source and drain electrodes. The etching stop layer is arranged between the semiconductor layer and the source and drain electrodes.

The source and drain buffer layers are respectively arranged between the source and drain electrodes and the semiconductor layer.

The source and drain electrodes are made from metal Cu electrode, and the source and drain buffer layers are made from Cu alloy.

A method for manufacturing an array substrate comprising a bottom gate TFT may comprise the following steps of:

S11, forming a pattern of a gate electrode on a substrate by using a patterning process;

S12, forming a pattern of a gate insulating layer on the substrate with the pattern of the gate electrode formed thereon by using a patterning process;

S13, forming a pattern of a semiconductor layer on the substrate with the pattern of the gate insulating layer formed thereon by using a patterning process;

S14, forming a pattern of an etching stop layer on the substrate with the pattern of the semiconductor layer formed thereon by using a patterning process, the etching stop layer having a source contact hole and a drain contact hole formed therein;

S15, forming a pattern of a source isolating layer and a patterned drain isolating layer on the substrate with the pattern of the etching stop layer formed thereon by using a patterning process;

S16, forming, on the substrate with the pattern of the source isolating layer and the patterned drain isolating layer formed thereon, a pattern of source buffer layer on the source isolating layer and a pattern of a source electrode on the source buffer layer, and a pattern of a drain buffer layer on the drain isolating layer and a pattern of a drain electrode on the drain buffer layer, by using a patterning process;

Furthermore, a method for manufacturing an array substrate comprising a top gate TFT may comprise the following steps of:

S21, forming a pattern of a semiconductor layer on a substrate by using a patterning process;

S22, forming a pattern of an etching stop layer on the substrate with the pattern of the semiconductor layer formed thereon by using a patterning process, the etching stop layer having a source contact hole and a drain contact hole formed therein;

S23, forming a pattern of a source isolating layer at the source contact hole and a pattern of a drain isolating layer at the drain contact hole on the substrate with the pattern of the etching stop layer formed thereon by using a patterning process;

S24, forming, on the substrate with the pattern of the source isolating layer and the pattern of the drain isolating layer formed thereon, a pattern of a source buffer layer on the source isolating layer and a pattern of a source electrode on the source buffer layer, and a pattern of a drain buffer layer on the drain isolating layer and a pattern of a drain electrode on the drain buffer layer, by using a patterning process;

S25, forming a pattern of a gate insulating layer on the substrate with the pattern of the source and drain electrodes formed thereon by using a patterning process;

S26, forming a pattern of a gate electrode on the substrate with the gate insulating layer formed thereon by using a patterning process;

For example, a pixel electrode may be formed concurrently with the formation of the source and drain isolating layers, and the formation of the pixel electrode may comprise: forming a conductive film on the substrate with the pattern of the etching stop layer formed thereon by using a film coating process; and forming, on the conductive film, a pattern of a source isolating layer at the source contact hole, a pattern of a drain isolating layer at the drain contact hole, and a pixel in the same level as the source isolating layer and the drain isolating layer, by using a patterning process.

For example, forming, on the substrate with the source isolating layer and the drain isolating layer formed thereon, the source buffer layer on the source isolating layer and the pattern of the source electrode on the source buffer layer, and the drain buffer layer on the drain isolating layer and the pattern of the drain electrode on the drain buffer layer, by using a patterning process, may comprise the steps of:

forming a Cu alloy film and a Cu film on the Cu alloy film in order on the substrate with the source isolating layer and the drain isolating layer formed thereon by using a film coating process;

heating the substrate with the Cu alloy film and the Cu film formed thereon, the Cu alloy film becoming a bi-layer film after being heated in which an upper layer is a Cu layer and the bottom layer is a metal layer formed by a metal other than Cu in the Cu alloy; and patterning the heated Cu alloy film and the Cu film so as to form the source and drain buffer layers, the source electrode on the source buffer layer and the drain electrode on the drain buffer layer.

For example, forming the Cu alloy film by using a film coating process may comprises a step of: forming a layer of Cu alloy film by using the film coating process in which the molar percent of other metal in the Cu alloy is in the range of 0.1% to 30%.

A process for manufacturing an array substrate is illustrated in the following by taking a top gate TFT as an example.

The method for manufacturing the array substrate provided by an embodiment of the present invention comprises the steps of:

Step 1: forming a pattern of a gate electrode and a gate line

First, layers of metal film are deposited in sequence on a transparent glass or quartz substrate by using sputtering or heat evaporation to a thickness of 2000 Å~5000 Å. A pattern of a gate electrode and a gate line is formed through one process of exposure and development, photolithography and etching. The shape and the position of the gate electrode and gate line thus formed are same as those in the state of art and will not be described here. The layer of metal film may be a layer of chrome (Cr), tungsten (W), titanium (Ti), thallium (Ta) or molybdenum (Mo) film or an alloy consisted of at least two thereof, and may be a single layer of metal film or a multi-layer metal film.

Step 2: forming a gate insulating layer

An insulating layer of a thickness in the range from 2000 Å to 5000 Å is deposited on the substrate obtained from step 2 by using chemical vapor deposition (PECVD) to form the gate insulating layer. The insulating layer may comprise oxide, nitride or oxynitride, and the corresponding reactant gases may comprise a mixture of silane (SiH4), ammonia (NH3) and nitrogen (N2), or a mixture of dichlorosilane (SiH2Cl2), ammonia (NH3) and nitrogen (N2).

Step 3: forming a semiconductor layer

A metal oxide film is continuously deposited the substrate with the gate insulating layer formed thereon by using sputtering process to a thickness of 50 Å~1000 Å, and a pattern of the semiconductor layer is formed through one process of exposure and development, photolithography and etching.

The metal oxide may be indium gallium zinc oxide (IGZO), hafnium indium zinc oxide (HIZO), indium zinc oxide (IZO), amorphous indium zinc oxide (a-InZnO), amorphous fluorine doped zinc oxide (ZnO:F), tin doped indium oxide (In2O3:Sn), amorphous molybdenum doped indium oxide (In2O3:Mo), chromium tin oxide (Cd2SnO4), amorphous aluminum doped zinc oxide (ZnO:Al), amorphous niobium doped titanium oxide (TiO2:Nb), chromium tin oxide (Cd—Sn—O), or other metal oxide.

Step 4: forming a pattern of an etching stop layer

An insulating layer is continuously deposited the substrate obtained from step 3 by PECVD to a thickness of 1000 Å~3000 Å, and a pattern of an etching stop layer is formed through one process of exposure and development, photolithography and etching. The etching stop layer comprises a source contact hole connected to the source electrode and a drain contact hole connected to the drain electrode. The insulating layer may comprise oxide, nitride or oxynitride, and the corresponding reactant gas may comprise SiH4, NH3 and N2 or comprise SiH2Cl2, NH3 and N2. Similar to the gate insulating layer, the etching stop layer may be designed to have two layers in order to improve the performance of the TFT, in which the first layer comprise SiNx and the second layer comprise SiOx that directly contacts the metal oxide. The bi-layer etching stop layer may be formed through one process of exposure and development, photolithography and etching on a bi-layer insulating layer.

Step 5: forming a pixel electrode and source and drain isolating layers

A transparent conductive layer is deposited on the substrate obtained from step 4 by using sputtering or heat evaporation to a thickness of about 100 Å~2000 Å. The transparent conductive layer may comprise ITO or IZO or other transparent metal oxide. The pixel electrode, the source isolating layer located at the source contact hole and covering the whole contact hole, and the drain isolating layer located at the drain contact hole and covering the whole contact hole, are formed through one process of exposure and development, photolithography and etching. The source isolating layer, the drain isolating layer and the pixel electrode are insulated from each other.

Step 6: forming a source buffer layer, a drain buffer layer, a source electrode and a drain electrode A Cu alloy is deposited on the substrate obtained from step 5 by sputtering or heat evaporation to a thickness of 40 Å~1000 Å, and a Cu layer is subsequently formed to have a thickness in the range of 1500 Å~4000 Å. The Cu alloy may be CuMn alloy, CuAl alloy or other Cu alloy. The molar percent of the atoms other than Cu atoms in the Cu alloy is in the range of 0.1%-30%. The source and drain electrodes and the data line, the drain buffer layer under the drain electrode, the source buffer layer under the source electrode, and a data line buffer layer under the data line are formed one process of exposure and development, photolithography and etching. Since the drain electrode and the drain buffer layer are formed in a same patterning process, they completely overlap in their shape. Similarly, the source electrode and the source buffer layer are formed in a same patterning process, and thus they completely overlap in their shape. The drain electrode and the drain buffer layer overlay a portion of the pixel electrode to ensure the connection of the drain electrode to the pixel electrode.

Step 7: forming a protection layer

A protection layer is deposited on the substrate obtained from step 6 by using PECVD to a thickness of 2000 Å~10000 Å. The protection layer may comprise oxide such as silicon oxide, nitride or oxynitride. When the oxide is silicon oxide, the corresponding reactant gas may comprise SiH4 and N2O. And the reactant gas corresponding to the nitride or oxynitride may comprise SiH4, NH3, N2 or comprise SiH2Cl2, NH3, and N2. The protection layer may employ a layer of Al2O3 film, or may be of a bi-layer or multi-layer barrier structure.

In addition, a gate pad (Gate PAD) region as well as a source and drain pad (SD PAD) region for subsequent connection of the gate line and data line to a circuit board may be formed through exposure and development, photolithography, etching and so on during this step.

For example, the protection layer may be formed by coating an organic resin layer of a thickness in the range of about 4000~30000 Å on the substrate with patterns of the source and drain electrodes and the data line formed thereon. The organic resin may be benzocyclobutene (BCB) or other organic photosensitive materials.

The Gate PAD and SD PAD are formed in the periphery region by coating an organic resin layer of a thickness in the range of about 4000~30000 Å and then performing one process of exposure, development, photolithography and etching.

Step 8: forming a common electrode

A transparent conductive film is deposited on the substrate obtained from step 7 by sputtering or heat evaporation to a thickness of about 300 Å~1500 Å.

The common electrode is formed through one exposure, development, photolithography and etching process. The common electrode may be formed of ITO or IZO, or other transparent conductive metal oxide.

The process flow for forming an array substrate comprising a top gate TFT is similar to those described in above steps 1-8 for forming the array substrate comprising a bottom gate TFT, and therefore will not be described herein.

An embodiment of the present invention further provides a display device comprising the array substrate mentioned above, and the display device may be for example such a display device as a liquid crystal panel, a liquid crystal display, a liquid crystal television, an OLED panel, an OLED display, an OLED television, an electric paper or the like.

One example of the display device is a liquid crystal display device in which an array substrate and a counter substrate are disposed opposite to each other to form a liquid crystal cell with a liquid crystal material filled therein. The counter substrate may be for example a color filter substrate. Each pixel unit on the array substrate is used to apply an electric field to control the rotation degree of the liquid crystal material so as to perform display operation. In some examples, the liquid crystal display device further comprises a backlight source for providing backlight to the array substrate.

Another example of the display device is an organic light-emitting diode (OLED) display device in which each pixel unit on the array substrate is connected to the anode or cathode of an organic electroluminescent device to drive the electroluminescent material so as to perform display operation.

In summary, the embodiments of the present invention provide a thin film transistor in which buffer layers are formed under the source and drain electrodes when forming the source and drain electrodes in order to improve the adhesion of the source and drain electrodes to the semiconductor layer. The buffer layer may be a Cu alloy layer. The Cu alloy layer can improve the adhesion of the source and drain electrodes thereon to the semiconductor layer therebeneath, and thus improves the performance of the TFT and the image quality. Furthermore, an insulating layer is arranged between the respective buffer layers and the semiconductor layer to prevent the metal atoms in the buffer layer from capturing the oxygen atoms from the semiconductor layer, which further improves the performance of the TFT. Since the isolating layer is a metal oxide layer and has a small contact resistance with the semiconductor layer, the performance of the TFT is improved. The pixel electrode is formed concurrently with the isolating layer, and thus no process is added as compared to the formation of the isolating layer in the state of art. The pixel electrode contacts the drain electrode through the buffer layer rather than a via, therefore breakage of the pixel electrode can be avoid and yield of the display device may be improved.

Obviously, one skilled in the art may make various changes and variations to the present invention without departing from the spirit and scope of the present invention. Therefore, the present invention intends to comprise the changes and variations made to the present invention if these changes and variations fall into the scope of the claims of the present invention and its equivalent.

The invention claimed is:

1. A thin film transistor comprising:
a substrate;
a gate electrode, a source electrode, a drain electrode and a semiconductor layer formed on the substrate;
a gate insulating layer between the gate electrode and the semiconductor layer or between the gate electrode and the source and drain electrodes;
an etching stop layer between the semiconductor layer and the source and drain electrodes having a source contact hole and a drain contact hole therein; and
a source buffer layer between the source electrode and the semiconductor layer and a drain buffer layer between the drain electrode and the semiconductor layer,
wherein the source and drain electrodes are metal Cu electrodes, and the source and drain buffer layers are Cu alloy layer;
wherein the source buffer layer directly contacts the etching stop layer, and the drain buffer layer directly contacts the etching stop layer; the source buffer layer directly contacts the source electrode, and the drain buffer layer directly contacts the drain electrode.

2. The thin film transistor according to claim 1, further comprising a conductive source isolating layer between the source buffer layer and the semiconductor layer and a conductive drain isolating layer between the drain buffer layer and the semiconductor layer.

3. The thin film transistor according to claim 2, wherein the source and drain isolating layers are arranged in a same layer, the source isolating layer completely covers the source contact hole, and the drain isolating layer completely covers the drain contact hole.

4. The thin film transistor according to claim 3, further comprising a pixel electrode layer arranged in a same layer with the source and drain isolating layers.

5. The thin film transistor according to claim 4, wherein the source and drain isolating layers and the pixel electrode layer are conductive layer of indium tin oxide or indium zinc oxide film.

6. The thin film transistor according to claim 1, wherein the source and drain buffer layers are a layer of copper aluminum alloy, copper manganese alloy, copper thallium alloy, copper titanium alloy or copper hafnium alloy.

7. The thin film transistor according to claim 2, wherein
the gate electrode is located on the substrate;
the gate insulating layer is located on the gate electrode;
the semiconductor layer is located on the gate insulating layer;
the etching stop layer is located on the semiconductor layer and has the source and drain contact holes therein;
the source and drain isolating layers are located on the etching stop layer, the source isolating layer contacts the semiconductor layer at the source contact hole, and the drain isolating layer contacts the semiconductor layer at the drain contact hole;

the source buffer layer is located on the source isolating layer, and the drain buffer layer is located on the drain isolating layer; and the source electrode is located on the source buffer layer, and the drain electrode is located on the drain buffer layer.

8. The thin film transistor according to claim 2, wherein the semiconductor layer is located on the substrate;

the etching stop layer is located on the semiconductor layer and has the source and drain contact holes therein;

the source and drain isolating layers are located on the etching stop layer, the source isolating layer contacts the semiconductor layer at the source contact hole, and the drain isolating layer contacts the semiconductor layer at the drain contact hole;

the source buffer layer is located on the source isolating layer, and the drain buffer layer is located on the drain isolating layer;

the source electrode is located on the source buffer layer, and the drain electrode is located on the drain buffer layer;

the gate insulating layer is located on the source and drain electrodes; and the gate electrode is located on the gate insulating layer.

9. The thin film transistor according to claim 1, further comprising a protection layer as the outmost layer of the thin film transistor, the protection layer comprises a portion in a displaying region of the substrate and a portion in a pad region in a periphery of the substrate.

10. An array substrate comprising the thin film transistor according to claim 1.

11. A method for manufacturing a thin film transistor comprising the steps of:

forming a pattern of a gate electrode, a pattern of a source electrode, a pattern of a drain electrode, and a pattern of a semiconductor layer;

forming a pattern of a gate insulating layer and a pattern of an etching stop layer; and forming a pattern of a source buffer layer and a pattern of a drain buffer layer, wherein the gate insulating layer is located between the gate electrode and the semiconductor layer or between the gate electrode and the source and drain electrodes, the etching stop layer is located between the semiconductor layer and the source and drain electrodes and has a source contact hole and a drain contact hole therein, the source and drain buffer layers are located between the source and drain electrodes respectively and the semiconductor layer, and wherein the source and drain electrodes are metal Cu electrodes, and the source and drain buffer layers are Cu alloy layer;

wherein the source buffer layer directly contacts the etching stop layer, and the drain buffer layer directly contacts the etching stop layer; the source buffer layer directly contacts the source electrode, and the drain buffer layer directly contacts the drain electrode.

12. The method according to claim 11, further comprising, before forming the source and drain buffer layers, forming a conductive source isolating layer between the source buffer layer and the semiconductor layer and a conductive drain isolating layer between the drain buffer layer and the semiconductor layer.

13. The method according to claim 12, comprising forming the pattern of the gate electrode on the substrate by using a patterning process;

forming the pattern of the gate insulating layer on the substrate with the pattern of the gate electrode formed thereon by using a patterning process;

forming the pattern of the semiconductor layer on the substrate with the pattern of the gate insulating layer thereon by using a patterning process;

forming the pattern of the etching stop layer on the substrate with the pattern of the semiconductor layer thereon by using a patterning process;

forming the pattern of the source and drain isolating layers on the substrate with the pattern of the etching stop layer thereon by using a patterning process; and forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process.

14. The method according to claim 12, comprising forming the pattern of the semiconductor layer on the substrate by using a patterning process;

forming the pattern of the etching stop layer on the substrate with the pattern of the semiconductor layer thereon by using a patterning process, the etching stop layer having a source contact hole and a drain contact hole therein;

forming the pattern of the source isolating layer at the source contact hole and a patterned drain isolating layer at the drain contact hole on the substrate with the pattern of the etching stop layer thereon by using a patterning process;

forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process;

forming the pattern of the gate insulating layer on the substrate with the pattern of the source and drain electrodes formed thereon by using a patterning process; and forming the pattern of the gate electrode on the substrate with the gate insulating layer formed thereon by using a patterning process.

15. The method according to claim 13, wherein the pixel electrode is formed in a same process as the source and drain isolating layers, and forming the pixel electrode, the source and drain isolating layers comprises:

forming a layer of conductive film on the substrate with the pattern of the etching stop layer formed thereon by using a film coating process; and forming the pattern of the source isolating layer at the source contact hole, the pattern of the drain isolating layer at the drain contact hole, and the pattern of the pixel electrode from the layer of conductive film by using a patterning process.

16. The method according to claim 13, wherein forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process comprises:

forming a layer of Cu alloy film and a layer of Cu film in this order on the substrate with the source and drain isolating layers formed thereon by using a film coating process;

heating the substrate with the layer of Cu alloy film and the layer of Cu film formed thereon such that the layer of Cu alloy film becomes a bi-layer film after being heated, the bi-layer film comprising a metal Cu layer as an upper layer and a metal film formed from the metal other than Cu in the Cu alloy as a lower layer; and patterning the layer of Cu alloy film and the layer of Cu film that have been heated so as to form the source and drain buffer layers, the source electrode on the source buffer layer and the drain electrode on the drain buffer layer.

17. The method according to claim 16, wherein forming the layer of Cu alloy film formed by using the film coating process comprise: forming a layer of Cu alloy film by using a film coating process, and the Cu alloy contains Cu and another metal, of which the molar percent in the Cu alloy is in the range of 0.1%~30%.

18. The method according to claim 14, wherein the pixel electrode is formed in a same process as the source and drain isolating layers, and forming the pixel electrode, the source and drain isolating layers comprises:

forming a layer of conductive film on the substrate with the pattern of the etching stop layer formed thereon by using a film coating process; and forming the pattern of the source isolating layer at the source contact hole, the pattern of the drain isolating layer at the drain contact hole, and the pattern of the pixel electrode from the layer of conductive film by using a patterning process.

19. The method according to claim 14, wherein forming, on the substrate with the source and drain isolating layers formed thereon, the source buffer layer located on the source isolating layer and the pattern of the source electrode located on the source buffer layer as well as the drain buffer layer located on the drain isolating layer and the pattern of the drain electrode located on the drain buffer layer, by using a patterning process comprises:

forming a layer of Cu alloy film and a layer of Cu film in this order on the substrate with the source and drain isolating layers formed thereon by using a film coating process;

heating the substrate with the layer of Cu alloy film and the layer of Cu film formed thereon such that the layer of Cu alloy film becomes a bi-layer film after being heated, the bi-layer film comprising a metal Cu layer as an upper layer and a metal film formed from the metal other than Cu in the Cu alloy as a lower layer; and patterning the layer of Cu alloy film and the layer of Cu film that have been heated so as to form the source and drain buffer layers, the source electrode on the source buffer layer and the drain electrode on the drain buffer layer.

\* \* \* \* \*